United States Patent [19]
Foreman et al.

[11] 4,246,494
[45] Jan. 20, 1981

[54] DIGITAL TOUCH CONTROLLED DIMMER SWITCH

[75] Inventors: Luther M. Foreman; William S. Hightower, both of San Antonio, Tex.

[73] Assignee: National Electric Corporation, Houston, Tex.

[21] Appl. No.: 968,862

[22] Filed: Dec. 12, 1978

[51] Int. Cl.³ .......................................... H05B 39/00
[52] U.S. Cl. .................................. 307/116; 307/157; 315/194; 200/5 R; 361/331
[58] Field of Search ................ 307/116, 150, 157; 361/181; 200/DIG. 1, 5; 340/365 R, 365 S, 365 G; 315/194, 291

[56] References Cited
U.S. PATENT DOCUMENTS

| | | | |
|---|---|---|---|
| 3,970,893 | 7/1976 | Bryant | 315/291 X |
| 4,055,735 | 10/1977 | Eachus et al. | 200/DIG. 1 |
| 4,119,864 | 10/1978 | Petrizio | 307/116 |

FOREIGN PATENT DOCUMENTS 2525006 9/1976 Fed. Rep. of Germany .......... 307/116

Primary Examiner—L. T. Hix
Assistant Examiner—James L. Dwyer
Attorney, Agent, or Firm—Pravel, Gambrell, Hewitt, Kirk, Kimball & Dodge

[57] ABSTRACT

A touch controlled dimmer switch is provided so that a user may indicate the level to which the illumination output of a light or lamp is to be maintained by touching a control keyboard. Digital control circuitry responds to touching of the keyboard by the user to adjust the amount of electrical power furnished to the lamp and regulate the illumination output.

7 Claims, 4 Drawing Figures

DIGITAL TOUCH CONTROLLED DIMMER SWITCH

TECHNICAL FIELD OF THE INVENTION

The present invention relates to switches for controlling the illumination output of light sources, such as lamps.

PRIOR ART

Although there are numerous types of light dimmer switches available which utilize manually operable knobs or switches, so far as is known to applicant none have been responsive to touch controls such as from a user's finger or the like to adjust the output from a lamp being controlled. Also, these types of dimmer controls used relatively inefficient circuits to regulate the flow of electricity to the lamp in response to the switch setting, often consuming a substantial amount of the power available to the lamp in order to control the output intensity of the lamp, an undesired form of waste.

SUMMARY OF INVENTION

Briefly, the present invention provides a new and improved touch controlled dimmer switch apparatus for controlling the illumination output of a light source or lamp. A plurality of conductive strips are located behind a touch pad and respond to a user touching the pad. The conductive strips are disposed so that the user may touch a particular location and specify a desired illumination output. A control circuit responds to a contact with one of the conductive strips to control the amount of power furnished to the light to thus control the illumination output of the light. To change the illumination output, the user contacts the touch pad at a different location. The apparatus of the present invention also includes a new and improved power supply for extracting direct current operating power for the apparatus from the alternating current being used to illuminate the light source.

DESCRIPTION OF PREFERRED EMBODIMENT

Figure 3:
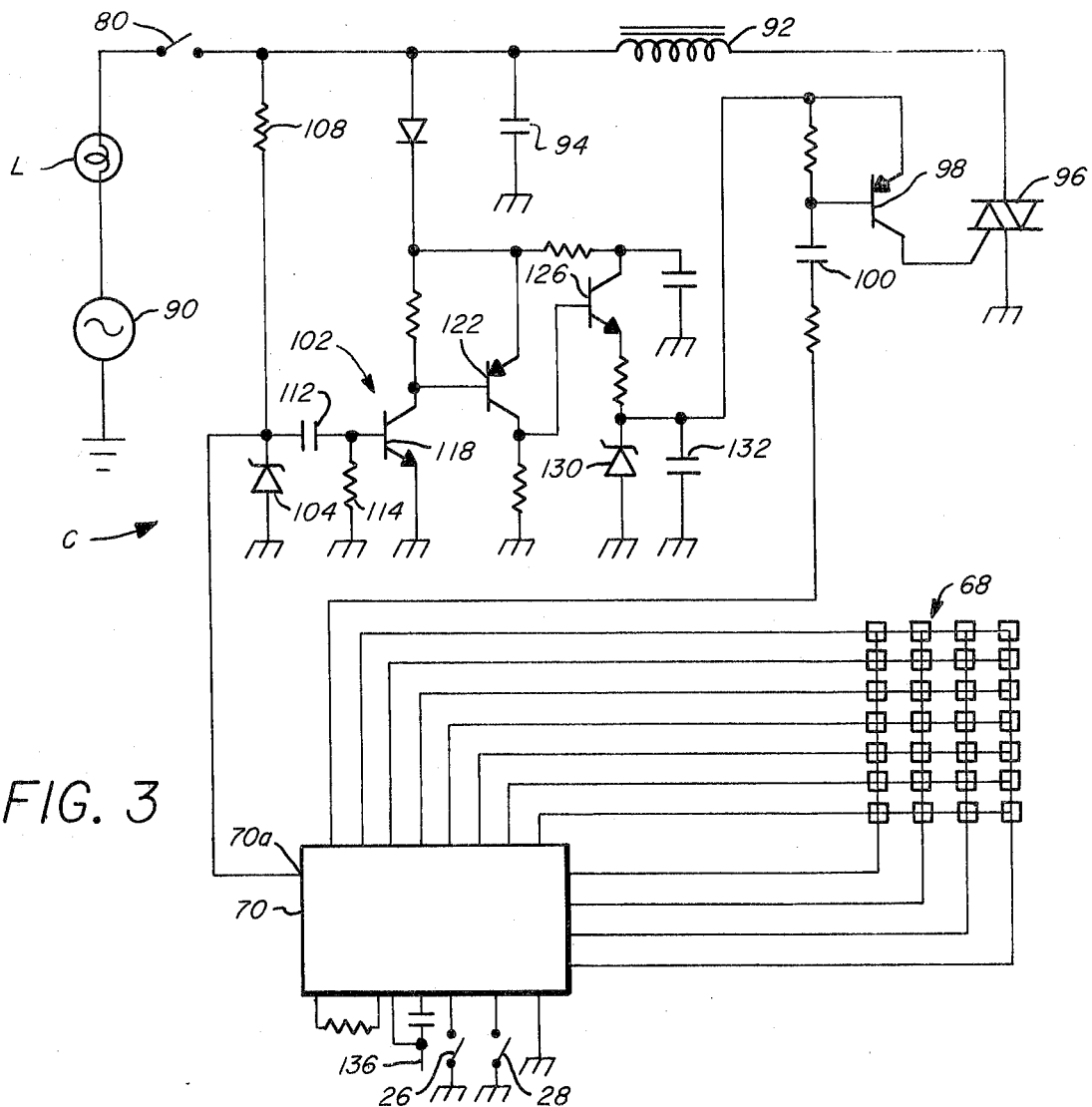
FIG. 3 is a schematic electrical circuit diagram of the apparatus of FIG. 1.
Figure 4:
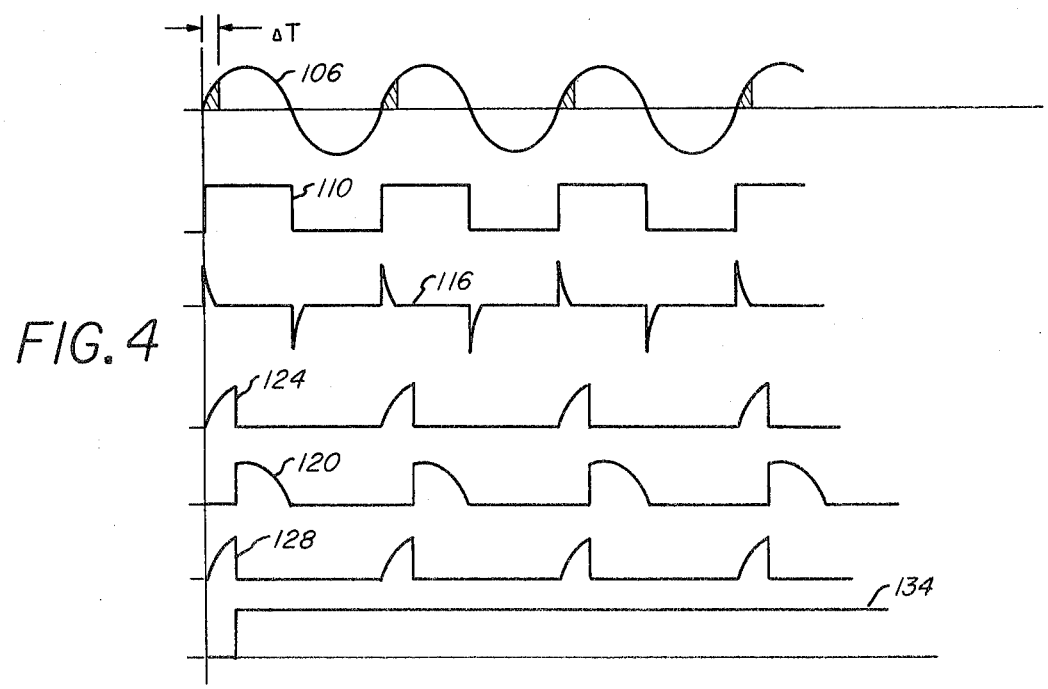
FIG. 4 is a voltage waveform diagram of waveforms present at certain locations in the circuit of FIG. 3.

In the drawings, the letter A designates a touch controlled dimmer switch apparatus according to the present invention for controlling the illumination output of a suitable light source L, such as a light or lamp. The apparatus A includes a touch pad P, mounted within a faceplate F, which a user may touch to indicate the level to which the illumination output of the lamp L is to be set. Depending upon the particular area of the touch pad P contacted by the user, a selected one of a plurality of conductive strips S is contacted so that a control circuit C (FIG. 3) regulates the amount of electrical power furnished to the lamp L to control the illumination output thereof. The conductive strips S are mounted on a printed circuit board B mounted within the faceplate F in a manner to be set forth below.

Figure 1:
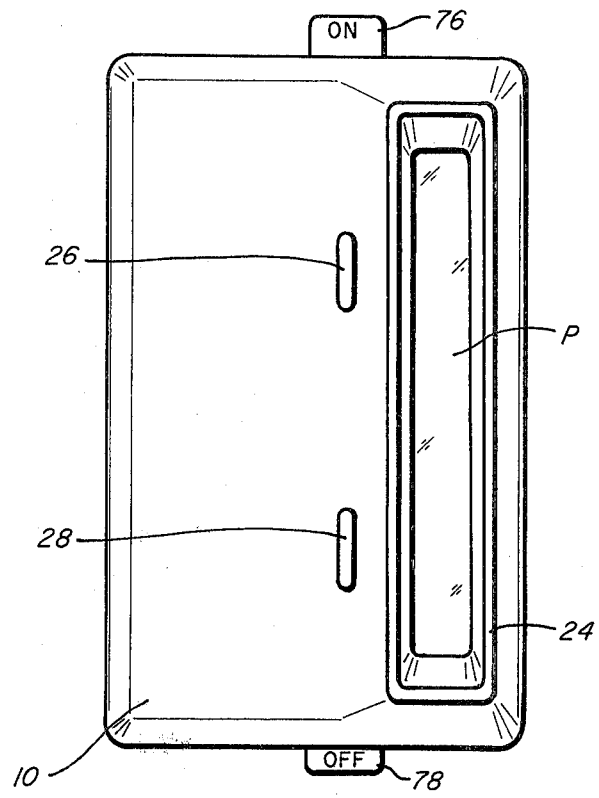
FIG. 1 is an elevation view of a touch dimmer switch apparatus for controlling lamp or light output intensity according to the present invention.
Figure 2:
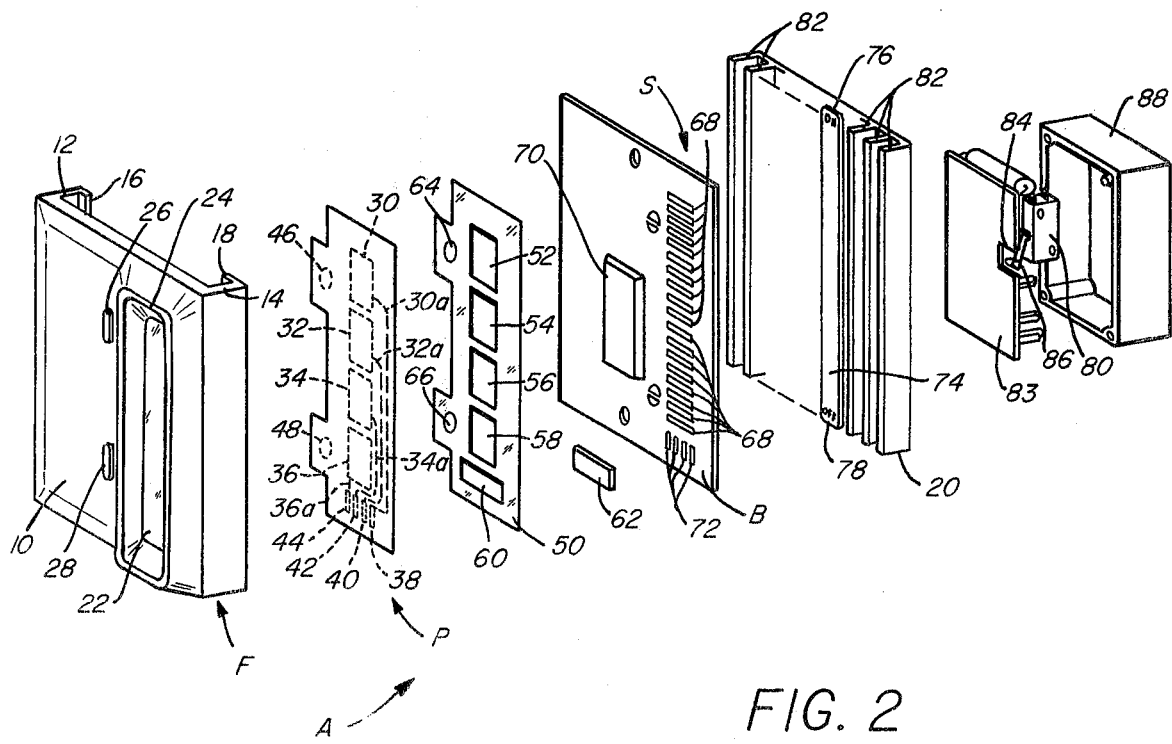
FIG. 2 is an exploded isometric view of the apparatus of FIG. 1.

The faceplate F (FIG. 1) includes a generally rectangular front face portion 10 having extending rearwardly therefrom enclosing arm members 12 and 14 having respective inwardly extending attachment lugs 16 and 18 for fitting behind a heat sink 20 (FIG. 2) and containing therein remaining portions of the apparatus A as will be more evident hereinbelow. The front face portion 10 of the faceplate F has a slot 22 formed therethrough so that a user may insert a finger or a suitable contact device or member to touch the touch pad P and control the illumination output of the light source L. A raised rim 24 is formed extending outwardly from the front face 10 of the faceplate F around the periphery of the slot 22 enclosing same. The raised rim 24 prevents inadvertent contact with the touch pad P and thereby prevents inadvertent changing of the illumination output of the light source when such change is not required or desirable. If desired, an increment up contact switch 26 and an increment down contact switch 28 are mounted with the faceplate F extending therethrough, permitting a user of the apparatus A to automatically adjust the illumination output of the light source being controlled upwardly or downwardly, in a manner to be set forth below.

The touch pad P is formed from a suitable flexible dielectric material, such as a synthetic resin, and has formed on a rear side thereof contact region conductive strips 30, 32, 34 and 36 which subdivide the conductive strips S into a plurality of contact regions. The contact region conductive strip 30 is electrically connected by deposited conductive material 30a to a lower contact area 38, while contact region conductive strips 32, 34 and 36 are similarly connected by conductive material to contact strips 40, 42 and 44 by conductive material 32a, 34a, and 36a, respectively. A conductive area or pattern 46 is formed on the touch pad P adjacent the increment up switch 26, while a similar conductive pattern 48 is formed on the touch pad P adjacent the increment down switch 28. Each of the foregoing conductive patterns on the reverse side of the touch pad P is adapted to contact one or more of the conductive strips S on the printed circuit board B and form an electrical ground therewith, for reasons to be set hereinbelow.

A spacer member 50 formed of a suitable dielectric material is mounted between the touch pad P and the conductive strips S, preventing electrical contact therebetween until the touch pad P is contacted by a user to adjust the output of the light L. The spacer 50 is preferably formed from a resilient material so that contact between the touch pad P and strips S is broken once the user's touch is removed. A perforation or opening 52 is formed in the spacer 50 adjacent the contact region conductive strip 30, while similar openings 54, 56 and 58 are formed adjacent the strips 32, 34, and 36, respectively. The openings 52, 54, 56 and 58 in the spacer divide the conductive strips S into a plurality of contact regions. Contact by the user with the touch pad P in the area of one of the strips 38, 40, 42 or 44 causes an electrical connection between the particular conductive region strip and an appropriate one of the conductor strips S on the printed circuit board B directly behind the contacted area of the touch pad P.

An opening 60 is formed in the spacer 50 adjacent a strip of compressively conductive connector material 62, which functions to sense that one of the conductive strips S has been contacted by a user. Openings 64 and 66 are formed in the spacer 50 adjacent the conductive areas 46 and 48 of the touch pad P, respectively, so that contact from a user on the switches 26 or 28 may be transferred to appropriate conductive strips S on the printed circuit B. The conductive strips S include a plurality of substantially horizontal incrementing conductive strips 68 formed on the printed circuit B which are arranged in a vertical row adjacent the openings 52, 54, 56 and 58 in the spacer 50 and are adapted to be contacted by the contact region conductive strips 30, 32, 34 and 36 in accordance with the particular area of the touch pad P contacted by the user. In the preferred embodiment, contact with the higher strips 68 indicates high lamp output intensity while the lower strips 68 signify lower intensity, although other assignments could as well be made. The strips 68 are electrically connected through conductive paths formed on the printed circuit B to a microprocessor integrated circuit or chip 70. A suitable chip 70, for example, is an Intel 8021 manufactured by Intel Corporation.

The microprocessor 70 receives at an input 70a the alternating current signal which provides operating power to the lamp L and detects zero crossings of such signal. The microprocessor 70 further sequentially scans the horizontal incrementing conductive strips 68 in a time division multiplex fashion to detect which, if any, of the conductive strips 68 has been contacted by the user through the touch pad P. The microprocessor 70 is also electrically connected through the strip of conductive material 62 in order to sense when one of the conductive strips 68 has been contacted. In this event, the microprocessor 70 electronically scans the strips 68 to determine which one of them has been contacted. Upon determining which strip 68 has been contacted, the microprocessor 70 provides an output signal to the control circuit C indicating the amount of time during each cycle of alternating current that the lamp L receives electrical power. By so controlling the amount of time the lamp L receives power, the microprocessor 70 controls the illumination output intensity of the lamp L.

The microprocessor 70 is further electrically connected to the increment up switch 26 and increment down switch 28. When a user contacts the switch 26, the microprocessor 70 automatically increments the conductive cycle of the lamp L upwardly until contact by the user with the switch 26 is removed, or until maximum output of the lamp L is obtained, whichever first occurs. Similarly, contact with the switch 28 causes the microprocessor 70 to decrement the conductive cycle of the lamp L to dim same until the lamp L is dimmest or until contact with the switch 28 is removed, whichever first occurs.

An on-off switch 74 in the form of an elongate tab member having an upper portion 76 extending above the faceplate F and the lower portion 78 extending below the faceplate F is mounted between the printed circuit board B and the heat sink 20. The switch 74 has a lug formed on a rear portion thereof for engaging a microswitch 80 activating the apparatus A or deactivating the apparatus A as the case may be. To activate the apparatus A, the user pulls the upper portion 76 upwardly by grasping the portion 76 or, alternatively by pushing up on portion 78. Conversely, in order to turn the apparatus A off, a user grasps the lower portion 78 and pulls downwardly thereon, or alternatively by pushing down on upper portion 76.

The heat sink 20 is formed from a suitable conductive material such as aluminum and has a plurality of heat dissipating vanes or fins 82 formed thereon to transfer the heat formed in the apparatus A to the air in the vicinity thereof. Certain of the fins 82 have not been shown in the drawings in order to maintain the simplicity thereof. A circuit board 83 having a slot 84 formed therein adjacent a contact 86 of the microswitch 80 contains thereon those portions of the control circuit K not mounted on the printed circuit board B. The circuit board 83 is mounted within a generally rectangular shaped housing 88 which is mounted to a wall or other surface for attaching the apparatus A thereto.

Considering the control circuit C more in detail (FIG. 3), conventional alternating current electrical power is provided to the lamp L from a suitable source 90. The lamp L is electrically connected to the control circuit C through the switch 80 which energizes and deenergizes the apparatus A in response to the switch 74. A radio frequency choke coil 92 and a capacitor 94 form a lowpass filter in order to minimize the effects of radio frequency interference caused by switching in the control circuit C.

An alternating current electrical switch 96, such as a triac, is electrically activated by the microprocessor 70 through a switching transistor 98 at predetermined times in order to limit the amount of time during which current may flow through the lamp L and thereby control the output intensity of the lamp L. A capacitor 100 is electrically connected between the transistor 98 and the microprocessor 70 in order to protect the microprocessor 70 from excessive current when the switch 96 is activated. The transistor 98 draws operating power from a power supply circuit 102 of the control circuit C which provides direct current for the apparatus A from the alternating current provided by the source 90. The power supply circuit 102 further provides operating direct current power for the processor chip 70.

Considering the power supply circuit 102 more in detail, a Zener diode 104 is electrically connected to the alternating current, as indicated by waveform 106, from the source 90 by a resistor 108. The Zener diode 104 forms a square wave 110 from the positive half cycles of the alternating current waveform 106. The microprocessor 70 detects rising and falling edges of the waveform 106 as zero crossings.

A capacitor 112 and a resistor 114 form a differentiator circuit which forms a series of alternating polarity pulses at each transition of the square waveform 110, as indicated by waveform 116. A transistor 118 is energized by the positive impulses of the waveform 116 and forms a series of pulses 120 at a collector terminal thereof. The pulses 120 de-energize a transistor 122, causing a train of pulses illustrated by a waveform 124 to be formed at a collector terminal thereof. The train of pulses 124 activates a transistor 126, causing a pulse waveform 128 to appear at an emitter terminal of the transistor 126 which are furnished through a Zener diode 130 to charge a capacitor 132. The capacitor 132 accumulates an electrical charge therein resulting from the pulse waveform 128 and is held at a substantially constant output voltage by the Zener diode 130, causing a substantially constant direct current power supply to appear across the capacitor 132. The direct current power in the capacitor 132 is provided as a bias voltage for the transistor 98 and also as an operating bias for the microprocessor 70 at an input terminal 136 thereof.

In the operation of the apparatus A, a user activates the apparatus A by means of the on-off switch 74. In order to set an output intensity for the lamp L, the user touches the touch pad P at an appropriate position thereon according to the desired output intensity. Contact by the user with the touch pad P causes the electrically conductive material on the rear surface thereof to contact a predetermined one of the conductive strips 68, forming an electrical ground which is detected as the multiplexer action of the microprocessor chip 70 sequentially scans such strips. The microprocessor 70 then controls the activation of the triac 96 by means of the transistor 98 so that a predetermined time after a zero crossing of the alternating current waveform 106 elapses before the triac 96 is de-activiated. Control of the activation time of the triac 96 controls the amount of time that the lamp L receives alternating current power, and accordingly controls the output intensity of the lamp L.

In the event it is necessary or desirable to adjust the output intensity of the lamp, the user merely touches the touch pad P at a new location, depending upon the amount of change in the output intensity of the lamp L. Alternatively, the user may adjust the intensity of the lamp L by means of the up switch 26 or down switch 28.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

We claim:

1. A touch controlled dimmer switch apparatus for controlling the illumination output of a light source or lamp comprising:
   (a) a touch pad for receiving contact from a user's touch;
   (b) a plurality of conductive strip members disposed behind said touch pad for responding to the user's touch and indicating a desired illumination output;
   (c) microprocessor circuit means comprising:
   (1) multiplexer means for scanning sequentially said plurality of conductive strip members in a time division multiplex fashion;
   (2) means to detect which, if any, of said conductive strips has been contacted from a user's touch through said touch pad; and
   (3) means to provide an output signal that controls the illumination output intensity responsive to which of said conductive strips has been contacted; and
   (d) control circuit means responsive to an indication from said conductive strip means to control the amount of electrical power to the light and thereby the illumination output of the light.

2. The apparatus of claim 1, wherein said conductive strips are divided into a plurality of contact regions.

3. The apparatus of claim 2, wherein said conductive strip means comprises:
   (a) a plurality of contact region conductive strips for sensing contact with a corresponding one of said plurality of contact regions; and
   (b) a plurality of incrementing conductive strips within each of said plurality of contact regions for designated selected increments of illumination output of the lamp.

4. The apparatus of claim 3, wherein said plurality of contact region conductive strips and said plurality of incrementing conductive strips are arranged in a matrix.

5. The apparatus of claim 1, further including:
   switch means for automatically incrementing the illumination output of the lamp up or down at a user's discretion.

6. The apparatus of claim 1, wherein the lamp is operated by alternating current and further including:
   power supply means for providing direct current power for the apparatus from the alternating current supplied to the lamp.

7. A power supply for providing direct current power for a touch controlled dimmer switch, which operates in response to a touch control switch responsive to a user's touch indicating a desired illumination output to a microprocessor, for controlling the illumination output of an alternating current light or lamp, comprising:
   (a) means responsive to zero crossing in the alternating current for forming a square wave;
   (b) switch means for forming charging pulses in response to said means for forming a square wave; and
   (c) capacitor means for receiving pulses from said switch means and storing electrical energy as direct current power for operating the microprocessor to control the lamp output.

* * * * *